United States Patent
Lei

(10) Patent No.: US 11,950,004 B2
(45) Date of Patent: Apr. 2, 2024

(54) COUNTING METHOD, A COUNTING DEVICE AND A COUNTING SYSTEM AND A PIXEL ARRAY USING THE COUNTING DEVICE

(71) Applicant: NINGBO ABAX SENSING CO., LTD., Zhejiang (CN)

(72) Inventor: Shuyu Lei, Shaanxi (CN)

(73) Assignee: NINGBO ABAX SENSING CO., LTD., Ningbo (CN)

( * ) Notice: Subject to any disclaimer, the term of this patent is extended or adjusted under 35 U.S.C. 154(b) by 381 days.

(21) Appl. No.: 17/239,594

(22) Filed: Apr. 24, 2021

(65) Prior Publication Data

US 2021/0243391 A1 Aug. 5, 2021

Related U.S. Application Data

(63) Continuation of application No. PCT/CN2019/089764, filed on Jun. 3, 2019.

(30) Foreign Application Priority Data

Oct. 24, 2018 (CN) .......................... 201811246783.6
Oct. 24, 2018 (CN) .......................... 201811246784.0

(51) Int. Cl.
*G11C 8/04* (2006.01)
*H04N 25/57* (2023.01)
*H04N 25/713* (2023.01)

(52) U.S. Cl.
CPC ............... *H04N 25/57* (2023.01); *G11C 8/04* (2013.01); *H04N 25/713* (2023.01)

(58) Field of Classification Search
None
See application file for complete search history.

(56) References Cited

U.S. PATENT DOCUMENTS

| | | | |
|---|---|---|---|
| 8,660,234 B2* | 2/2014 | Bender | H03K 21/00 377/49 |
| 9,735,787 B2* | 8/2017 | Burbano | G06F 1/022 |
| 11,070,211 B2* | 7/2021 | Wright | H03K 23/40 |
| 2011/0119321 A1 | 5/2011 | Ishikawa | |

FOREIGN PATENT DOCUMENTS

| | | |
|---|---|---|
| CN | 1858855 A | 11/2006 |
| CN | 101488749 A | 7/2009 |
| CN | 103731610 A | 4/2014 |
| CN | 104378559 A | 2/2015 |
| CN | 106303313 A | 1/2017 |

* cited by examiner

*Primary Examiner* — Cassandra F Cox

(57) ABSTRACT

A counting method, a counting device, and a counting system and a pixel array using the counting device are provided. The counting device includes a storage module, which comprises multiple storage units in cascade interconnection, the multiple storage units store a plurality of cumulative count values, the multiple storage units are configured as at least one group of storage units; an arithmetic module connected to a first group of storage units and a last group of storage units for calculation according to a received count value and an added cumulative count values input through the last group of the storage units so as to obtain a current added cumulative count values of corresponding objects, which is then output to the first group of the storage units in cascade interconnection.

20 Claims, 5 Drawing Sheets

Prior Art

COUNTING METHOD, A COUNTING DEVICE AND A COUNTING SYSTEM AND A PIXEL ARRAY USING THE COUNTING DEVICE

CROSS-REFERENCE TO RELATED APPLICATIONS

The present application is a continuation of International application No. PCT/CN2019/089764, designating the United States, filed on Jun. 3, 2019, which claims priority of Chinese patent application No. 201811246784.0, filed on Oct. 24, 2018 and titled counting method, counting system, counting device and counter, and Chinese patent application No. 201811246783.6, filed on Oct. 24, 2018 and titled counting method, counting system, counting device and counter, the contents of which are incorporated herein by reference in their entireties.

TECHNICAL FIELD

This disclosure relates to microelectronics, especially to a counting method, a counting device and a counting system and a pixel array using the counting device.

BACKGROUND

Dynamic range is defined as one of the most important parameters of sensor pixel array as a sensor with high dynamic range is conducive to meeting high precision requirement and increases response range of the sensor, and this is especially true when it comes to image sensors. In order to improve the dynamic range of an image sensor, one usually increases the number of circuits in pixel to achieve partial digitization by counting during pixel integration. However pixel has limited area to include indefinitely increasing circuits, therefore various methods are adopted to reconcile this drawback, which includes changing the value of the integral capacitor, changing the integral time, changing the column-level gain, and multiple exposures. Even though these proposed methods help improve dynamic range, they are unable to satisfy requirements of high dynamic range or strong anti-interference at the same time, which causes difficulty to achieve high-precision measurement requirement under large background light, high frame rate, large array and other ranging scenarios.

The counting method used in a sensor for circuit integration directly affects the dynamic range of the sensor, which in turn prejudices the overall performance of the sensor. The counting device adopted in existing sensors for circuit integration is normally an asynchronous counter or a synchronous counter composed of a data flip-flop. A data flip-flop usually has two states. The two states are represented by 0 and 1, which enables the data flip-flop to flip from one state to the other state so as to trigger corresponding settings. Existing counting devices are further provided with two latches to cooperate with the toggle action of the two states of the data flip-flop, such as a 4-bit asynchronous counter configured with data flip-flops in cascaded interconnection. However the counting device with such configuration will inevitably have large size, which will take up more pixel area if packed inside a pixel and in turn leads to difficulty in optimizing the pixel area. Packing the counting device outside a pixel will jeopardize the purpose of improving the dynamic range which in turn results in the sensor having small dynamic range and poor sensing performance.

The counting method adopted in existing sensors for circuit integration is therefore concluded to have various drawbacks such as data flip-flops taking up so much internal area of a sensor, small dynamic range. These drawbacks cause dramatic reduction of sensor performance therefore it is urgent to design a counting solution to overcome the above drawbacks.

SUMMARY

The embodiments of the present invention provide a counting method, a counting device and a counting system using the counting device and a pixel array to reduce the internal area taken up by the counting circuit, and to improve the dynamic range and performance of sensors.

In order to overcome the abovementioned drawbacks of existing techniques, the present invention proposes a counting method, a counting device and a counting system using the counting device and a pixel array.

A first aspect of the present application provides a counting device including at least a storage module and an arithmetic module. The storage module comprises a plurality of storage units in cascade interconnection. The storage units are configured to store a plurality of cumulative count values. The plurality of storage units are configured as at least one group of storage units, and in each group the number of the storage units in each group is greater than the number of the storage units storing a cumulative count values. The arithmetic module is connected to a first group of storage units and a last group of storage units for calculation according to a received count value and an added cumulative count values input through the last group of the storage units. The calculation aims at obtaining a current cumulative count values of corresponding objects and then outputting to the first group of the storage units of the multiple storage units in cascade interconnection. The plurality of cumulative count values are end-around shifted to the arithmetic module for calculation with a corresponding count value. Upon finishing counting, multiple current added cumulative count values stored in the storage module are used as a plurality of cumulative counting results of corresponding objects.

A counting device of an embodiment of the present invention further includes a control module connected to the storage module for outputting signals for selecting a horizontal line. The signals for selecting a horizontal line are configured to control an end-around shift of the plurality of cumulative count values stored in the a plurality of storage units.

In an embodiment of the present invention, the plurality of storage units are configured as at least two groups of storage units. A storage unit located in a preset position of the groups of the storage units is subject to the same signal for selecting a horizontal line.

In an embodiment of the present invention, the plurality of storage units each comprises at least two storage units. Different storage units in a group of storage units correspond to different signals for selecting a horizontal line.

In an embodiment of the present invention, the signal for selecting a horizontal line controls the end-around shift of the plurality of cumulative count values stored in the multiple storage units. This means that the signals for selecting a horizontal line are output in sequence to select the storage units controlled by the output signals for selecting a horizontal line for storage. If a storage unit is selected for storage, the cumulative count values of which will be replaced with a current cumulative count values stored in the storage unit that is connected to the selected storage unit along a preset direction, or be replaced with the current cumulative count values output from the arithmetic module that is connected to the selected storage unit along the preset direction.

In an embodiment of the present invention, the counting device further comprises an output module connected to the arithmetic module for outputting the plurality of cumulative count values.

In an embodiment of the present invention, the control module is configured to output a plurality of signals for selecting a horizontal line corresponding to the plurality of storage units according to a preset sequence, and one signal for selecting a horizontal line corresponds to at least one storage unit. The storage module is configured to receive the signals for selecting a horizontal line corresponding to different storage units and cyclically output the plurality of cumulative counting results to the arithmetic module. The output module is operable to receive and output the plurality of cumulative counting results.

In an embodiment of the present invention, each storage unit is provided with at least one latch and comprises the same number of latches; and the latches at corresponding positions of different storage units are sequentially in cascade interconnection.

In an embodiment of the present invention, the arithmetic module is configured with at least one calculation unit, the number of the calculation units configured for the arithmetic module matches the number of the latches in the storage units. Each calculation unit is in cascade interconnection with the latches corresponding to a first storage unit and a last storage unit respectively.

In an embodiment of the present invention, the calculation unit is configured as a half adder or a half subtractor.

A second aspect of the embodiments of the present invention provides a counting method, which is applied to any one counting device in the first aspect of the present invention. The counting device comprises the storage module and the arithmetic module. The storage module comprises the multiple storage units in cascade interconnection, the arithmetic module is connected both to the first group of the storage units and the last group of the storage units of the multiple storage units. The multiple storage units store the plurality of cumulative count values. The multiple storage units are configured as at least one group of the storage units and the number of the storage units in each group is greater than the number of the storage units in each group storing the cumulative count values. The counting method is carried out as follows.

The plurality of cumulative count values are end-around shifted to the arithmetic module for calculation with the corresponding count value until the counting is completed. The current added cumulative count values stored in the storage module are used as the plurality of cumulative counting results of corresponding objects.

Each control cycle of the end-around shift goes through the following procedures at least once:

The arithmetic module calculates the count value of a object with the added cumulative count values currently stored in the last group of the storage units so as to obtain the current added cumulative count values of the object.

The current added cumulative count values are output to the first group of the storage units of the multiple storage units in cascade interconnection for storage.

An embodiment of the present invention further comprises a control module outputting multiple signals for selecting a horizontal line to the storage units for controlling the end-around shift of the plurality of cumulative count values stored in the multiple storage units.

In an embodiment of the present invention, the storage units are configured as a at least two groups of storage units, and the storage unit at a preset position of the multiple groups of the storage units is controlled by the same signal for selecting a horizontal line.

In an embodiment of the present invention, each group of storage units comprises at least two rows of storage units, and different storage units in a group correspond to different signals for selecting a horizontal line.

In an embodiment of the present invention, the controlling the end-around shift of the plurality of cumulative count values stored in the multiple storage units comprises: outputting by the control module the signals for selecting a horizontal line in sequence to the multiple storage units; and replacing a cumulative count value of a selected storage unit with a cumulative count value currently stored in a storage unit that is adjacently connected to the selected storage unit along a preset direction, or with a current cumulative count value output from the arithmetic module that is connected to the selected storage unit along the preset direction.

In an embodiment of the present invention, the counting device further comprises the plurality of cumulative counting results output through the output module.

In an embodiment of the present invention, before outputting the plurality of cumulative counting results through the output module, the control module outputs multiple signals for selecting a horizontal line corresponding to the storage units according to the preset sequence. each signal for selecting a horizontal line corresponds to at least one storage unit. The storage module thus receives the signals for selecting a horizontal line corresponding to different storage units and cyclically outputs the plurality of cumulative counting results to the arithmetic module, the output module is able to receive and then output the plurality of cumulative counting results.

In an embodiment of the present invention, each storage unit is provided with at least one latch. Different storage units comprise the same number of the latches and the latches at corresponding positions of different storage units are sequentially in cascade interconnection.

In an embodiment of the present invention, the arithmetic module is configured with at least one calculation unit. The number of the calculation units configured for the arithmetic module matches the number of the latches in the storage units. Each calculation unit is in cascade interconnection with the latches corresponding to the first storage unit and the last storage unit respectively.

In an embodiment of the present invention, the calculation unit is further configured with a half adder or a half subtractor.

In an embodiment of the present invention, the plurality of cumulative counting results are operable to indicate a total charge amount collected by the charge storage units in individual pixels. A comparison unit is provided to obtain a current count value by comparing an integral voltage converted from a current charge collected by a charge storage unit in multiple pixels with a preset reference voltage.

A third aspect of the present application provides a counting system, which comprises at least a counting device as illustrated in the first aspect.

A fourth aspect of the present application provides a pixel array. Multiple pixels in the pixel array are connected to any one of counting devices as illustrated in the first aspect so as to determine a charge collected by the multiple pixels in the pixel array.

The technical solution provided in the embodiments of the present invention is configured with the multiple storage units in cascade interconnection and a shared arithmetic module. The multiple storage units end-around shift to store the plurality of cumulative counting results of corresponding objects obtained from the shared arithmetic module. This configuration enables each storage unit to replace multiple latches corresponding to the existing data flip-flops in the prior art to carry out the function of storing count values, and in turn to dramatically reduce an area of the storage module in the counting device and to improve the dynamic range of a sensor. Moreover, an area required by the counting device is further reduced by sharing the arithmetic module, which facilitates the structural optimization of the sensor. In particular, if multiple objects are sharing the arithmetic module, the multiple storage units and other related modules, such as an output module, a comparison module, etc., the area of the counting device required for the multiple objects could be effectively reduced, and the counting device could be improved. This in turn improves the dynamic range and the performance of the sensor and is of assistance in configuring a circuit element that is composed of multiple objects in a small pixel.

DETAILED DESCRIPTION OF EMBODIMENTS

Figure 1:
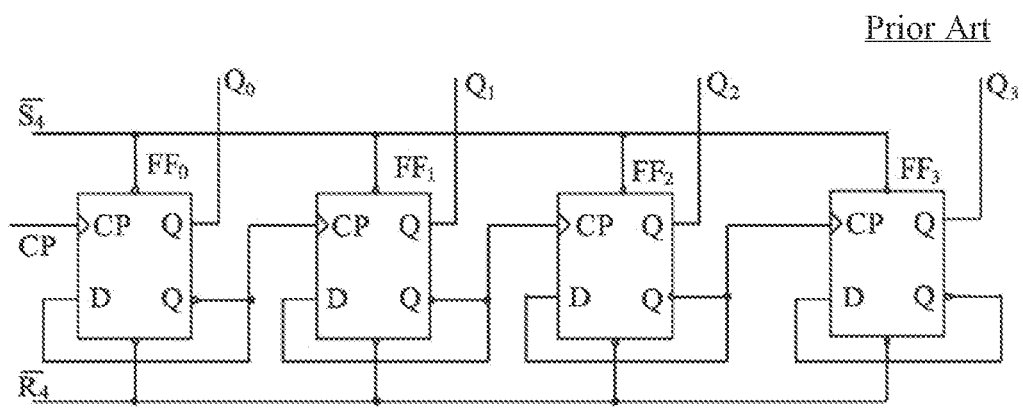
FIG. 1 is a schematic diagram showing a counting circuit provided in the prior art.

Embodiments will be detailed as reference hereinafter to illustrate the principle and spirit of the present invention. It should be understood that the following embodiments are only proposed to give the skilled in the art a better understanding so as to implement the present invention rather than limiting the protection scope of the present invention. These embodiments are provided to make the disclosure more thorough and complete and to fully convey the scope of the present disclosure to the skilled in the art.

It should be understood that when describing units/modules as "interconnected", it means a unit/module is either directly interconnected to the other unit/module or third units/modules are existing in between. When describing units/modules as "directly interconnected", it means no third units/modules existing in between.

Dynamic range is defined as one of the most important parameters of a sensor as a sensor with high dynamic range is conducive to meeting high precision measurement requirement and helps improve the measurement range of the sensor, especially helps improve the measurement range of an image sensor. The counting method used in a sensor for circuit integration causes restriction to the circuit design of a sensor, and area optimization etc., which in turn adversely affects parameters such as the area, the response speed, and the dynamic range of the sensor and further prejudices the overall performance of the sensor.

It has been found that the counting device used in the existing sensors for circuit integration is usually an asynchronous counter or a synchronous counter composed of a data flip-flop. However such configuration will take up more pixel area if packed inside a pixel and in turn leads to difficulty in optimizing the pixel area. Besides, the dynamic range of the sensor in such counting devices is subject to the dynamic range of the data flip-flop, which results in the sensor having small dynamic range and poor sensing performance.

In order to overcome the abovementioned drawbacks of the existing techniques, the present invention proposes a counting method, a counting device and a counting system and a pixel array to reduce the internal area of the sensor taken up by the counting circuit and improve the dynamic range and the performance of the sensor. The counting device includes a storage module and an arithmetic module. The storage module includes multiple storage units in cascade interconnection; where the multiple storage units store a plurality of cumulative count values. The multiple storage units are configured as at least one group of the storage units and the number of the storage units in each group is greater than the number of the storage units in each group storing a cumulative count values. The arithmetic module is connected both to a first group of the storage units and a last group of the storage units of the multiple storage units for calculation according to a received count value and an added cumulative count values input through the last group of the storage units. The calculation aims at obtaining a current added cumulative count value of corresponding objects and then outputting to the first group of the storage units of the multiple storage units in cascade interconnection. The plurality of cumulative count values thus end-around shift to the arithmetic module for calculation with a corresponding count value. Upon finishing counting, multiple current added cumulative count values stored in the storage module are used as a plurality of cumulative counting results of corresponding objects.

The counting device provided by the present invention is configured with the multiple storage units in cascade interconnection and a shared arithmetic module. The multiple storage units end-around shift to store the plurality of cumulative counting results of corresponding objects obtained from the shared arithmetic module. This configuration enables each storage unit to replace multiple latches corresponding to the existing data flip-flops in the prior art to carry out the function of storing count values, and in turn to dramatically reduce an area of the storage module in the counting device and to improve the dynamic range of a sensor. Moreover, an area required by the counting device is further reduced by sharing the arithmetic module, which facilitates the structural optimization of the sensor. In particular, if multiple objects are sharing the arithmetic module, the multiple storage units and other related modules, such as an output module, a comparison module, etc., the area of the counting device required for the multiple objects could be effectively reduced, and the counting device could be improved. This in turn improves the dynamic range and the performance of the sensor and is of assistance in configuring a circuit element that is composed of multiple objects in a small pixel.

The device, the method, the system and the pixel array herein are based on the same inventive concept. Since drawbacks reconciled by the device, method, system and pixel array herein are based on the same inventive concept, the implementation of the device, method, system and pixel array could be used as reference with each other, therefore the same implementation will be omitted.

The technical solution provided by the embodiments of the present invention is applicable to counting scenario, especially to scenarios where multiple identical objects or multiple similar objects to be counted. Specifically, the technical solution provided by the embodiments of the present invention is applicable to counting the amount of charges collected by pixels, resetting pixels, and other counting scenarios for other objects. For example, the counting device provided by the present invention could be applied to a frequency division circuit. Taking the frequency division circuit of a four-bit addition counter as an example, the four-bit addition counter starts counting from 0000, and a peripheral circuit resets the four-bit addition counter when it counts to 0011. After the resetting, the four-bit addition counter restarts counting from 0000. In this case, the number of input pulses is 4, which means that the frequency is divided by 4. This pulse is a divided pulse signal, so that the oscillator source can generate clock signals of different frequencies through the four-bit addition counter.

The technical solution provided by the embodiments of the present invention is applicable to various metering systems or metering circuits, especially to the metering circuits used in small sensors or micro sensors, such as the counting circuit in the pixel array of a sensor, the charge counting circuit, and the charge collecting circuit.

Figure 2:
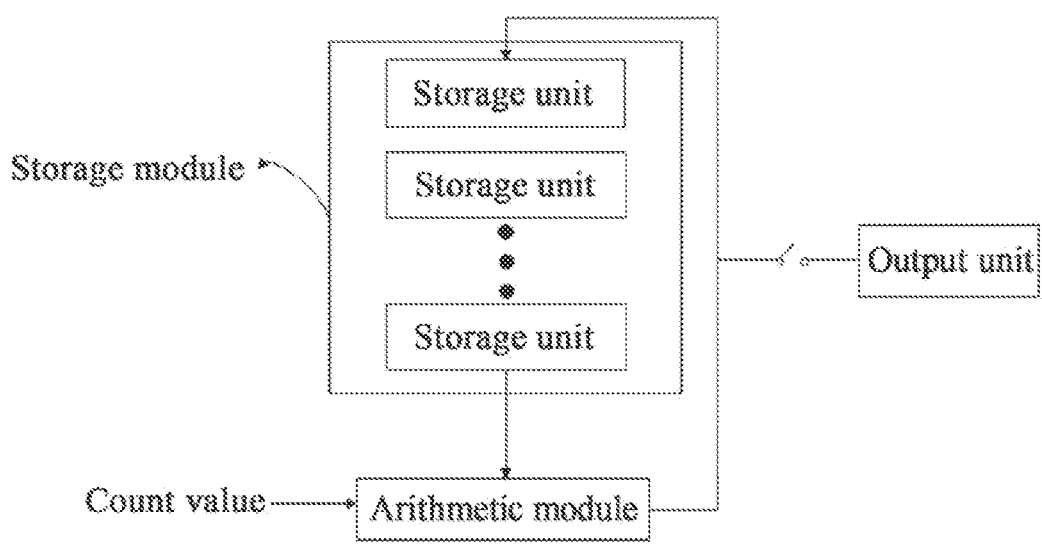
FIG. 2 is a schematic diagram showing a counting device in accordance with an embodiment of the present disclosure.

The embodiments of the present invention provide a counting device as shown in FIG. 2, which at least includes a storage module and an arithmetic module.

The storage module comprises multiple storage units in cascade interconnection; where the multiple storage units store a plurality of cumulative count values. The multiple storage units are configured as at least one group of the storage units and the number of the storage units in each group is greater than the number of the storage units in each group storing a cumulative count values.

The arithmetic module is connected both to a first group of the storage units and a last group of the storage units of the multiple storage units for calculation according to a received count value and an added cumulative count values input through the last group of the storage units. The calculation aims at obtaining the current added cumulative count values of corresponding objects and then outputting to the first group of the storage units of the multiple storage units in cascade interconnection.

The plurality of cumulative count values thus end-around shift to the arithmetic module to be calculated with a corresponding count value. Upon finishing counting, the multiple current cumulative count values stored in the storage module are used as a plurality of cumulative counting results of corresponding objects.

It should be noted that if the difference between the number of the storage units in each group of the storage units and the cumulative count values of the group of the storage unit is greater than or equals to a set value, for example the set value is 1, the arithmetic modules thus is preferably connected between the first group of the storage units and the last group of the storage units of the storage module.

The counting device as shown in FIG. 2 is configured with the multiple storage units in cascade interconnection and a shared arithmetic module. The multiple storage units end-around shift to store the plurality of cumulative counting results of corresponding objects obtained from the shared arithmetic module. This configuration enables each storage unit to replace multiple latches corresponding to the existing data flip-flops in the prior art to carry out the function of storing count values, and in turn to dramatically reduce the area of the storage module in the counting device and to improve the dynamic range of a sensor. Moreover, the area required by the counting device is further reduced by sharing the arithmetic module, which facilitates the structural optimization of the sensor. In particular, if multiple objects are sharing the arithmetic module, the multiple storage units and other related modules, such as an output module, a comparison module, etc., the area of the counting device required for the multiple objects could be effectively reduced, and the counting device could be improved. This in turn improves the dynamic range and the performance of the sensor and is of assistance in configuring a circuit element that is composed of multiple objects in a small pixel, such as a pixel array composed of multiple pixel units and counting circuit.

In the embodiments of the present invention, the multiple storage units could be storage units with the same structure or with different structures. The number of the storage units configured for different groups of the storage units is at least two. Different groups of the storage units could be configured with the same quantity of the storage units or with different quantities of the storage units. The storage units are configured with components that are not limited to latches or other components. A connection between groups of the storage units could be in series, divided by groups and then in cascade, or other connection methods, which is not limited by the embodiments of the present invention.

For example, if the number of the storage units is n, as shown in FIG. 2, the multiple storage units in cascade interconnection are respectively numbered as a storage unit 1 to a storage unit n, where n is a positive integer. The multiple storage units are further divided into multiple groups, where the storage unit 1 is a first storage unit of the first group of the storage units and the storage unit n is a last storage unit of the last group of the storage units.

Figure 4:
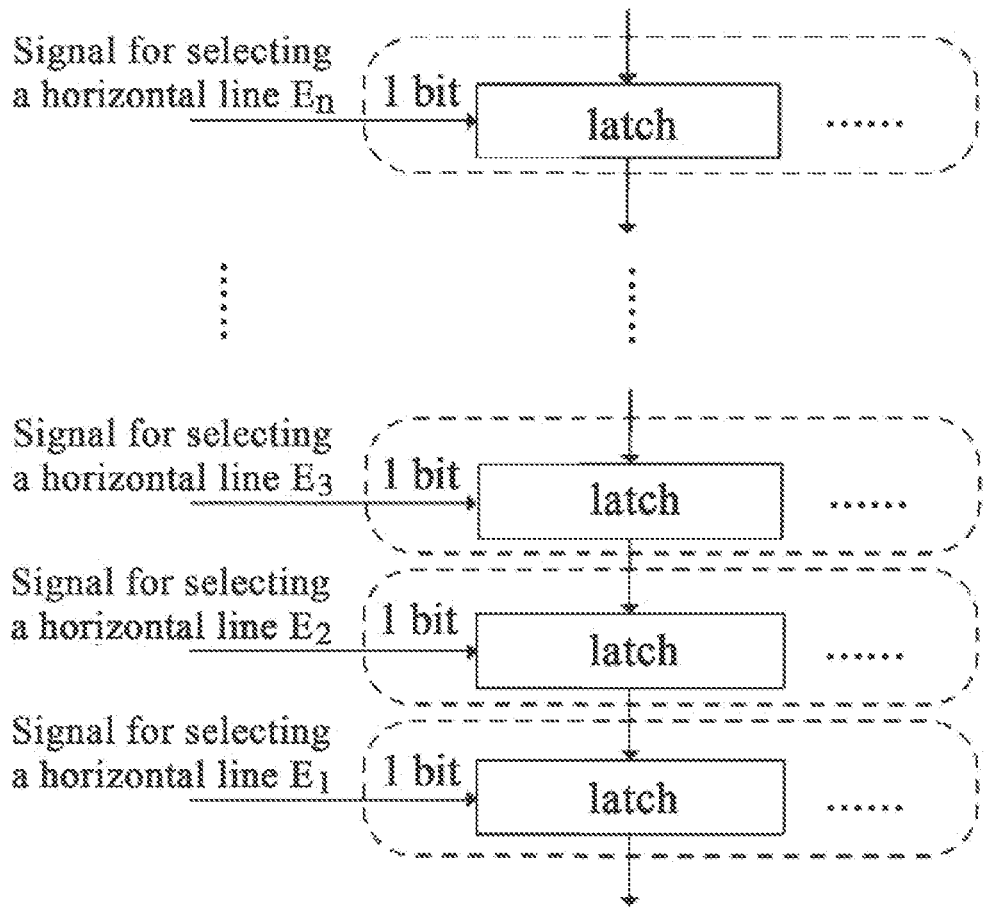
FIG. 4 is a schematic diagram showing a storage module in accordance with an embodiment of the present disclosure.
Figure 5:
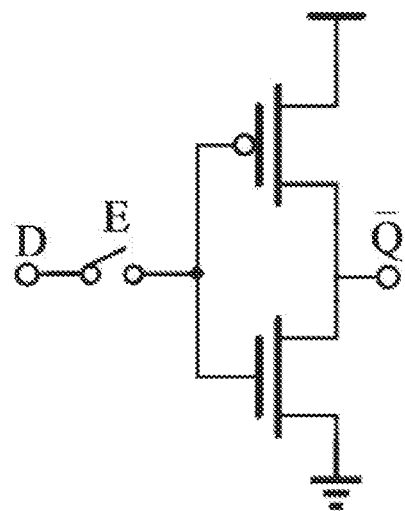
FIG. 5 is a schematic diagram showing a latch in accordance with an embodiment of the present disclosure.

In a case of a possible implementation, each storage unit is further provided with at least one latch. Different storage units comprise the same number of the latches and the latches at corresponding positions of different storage units are sequentially in cascade interconnection. Optionally, each group of the storage units comprises multiple storage units and the storage units provided in different groups of the storage units are of the same quantity. Taking the counting device shown in FIG. 3 as an example, the multiple storage units are divided into N groups of the storage units that are connected in series. Each group of the storage units has the same quantity of storage units, which means each group of the storage units comprises n storage units, where the unit capacity of each storage unit is i-bit. Each storage unit adopts i latches where i is an integer greater than or equals to 1. Each group of the storage units of the storage module as shown in FIG. 4 further comprises n storage units. The n storage units of each group of the storage units respectively correspond to n signals for selecting a horizontal line E1, E2 . . . En and are controlled by the n signals for selecting a horizontal line. Preferably, the latch comprises a switch and an inverter. The latch as shown in FIG. 5 comprises a MOS switch tube and the inverter consisting of an N-type MOS tube and a P-type MOS tube. In this case, the storage unit adopts the latch to store the cumulative count values or the cumulative counting results. The storage method connects the multiple latches in cascade interconnection without setting a switch but shares an active area of a front-stage output and a rear-stage output to enable each latch to be functioning as corresponding latches in the existing data flip-flop. This reduces at least half of the storage area of the storage module.

In the embodiments of the present invention, the multiple storage units store the plurality of cumulative count values. It may be one storage unit corresponding to one cumulative count values or one storage unit corresponding to the plurality of cumulative count values; this is not limited in the embodiments of the present invention. The number of the storage units in each group is greater than the number of the storage units in each group storing the cumulative count values.

The multiple storage units end-around shift to store the corresponding plurality of cumulative count values. One possible embodiment may be implemented in a way that before the end-around shift starts, and each group of the storage units reserves at least one storage unit to be free from storing the cumulative count values. The at least one free storage unit is functioning as a shared storage unit, which stores the corresponding cumulative count values from the same group of the storage units. In the case where the group of the storage units comprises multiple storage units, the cumulative count values stored by the shared storage unit are passed down from other adjacent storage units in the same group of the storage units. An initial stored value of the shared storage unit is 0, and the count value stored in the shared storage unit is cleared to 0 every time after each round of counting. Optionally, the shared storage unit is disposed at a connection position between adjacent storage units or at other positions of the group of the storage units, which is not limited in this embodiment.

The end-around shift of the plurality of cumulative count values between multiple storage units could be realized in various ways, which is not limited in the embodiments of the present invention. Taking one single cumulative count values out of the plurality of cumulative count values to explain one implementation manner of the end-around shift; the multiple storage units store one cumulative counting result calculated from its corresponding cumulative count values in one storage unit corresponding to the single cumulative count values and shift the single cumulative count values along a preset direction to another storage unit to be stored.

In order to end-around shift the plurality of cumulative count values between the multiple storage units, the counting device is further comprises a control module connected to the storage module. The control module operates to output the signals for selecting a horizontal line. The signals for selecting a horizontal line control the end-around shifts of the plurality of cumulative count values stored in the multiple storage units. In specific, the signals for selecting a horizontal line are output in sequence to select one or the multiple storage units controlled by the output signals for selecting a horizontal line for storage; if a storage unit is selected for storage, the cumulative count values of the selected storage unit will be replaced with the current cumulative count values stored in the storage unit that is adjacently connected to the selected storage unit along the preset direction, or be replaced with the current cumulative count values output from the arithmetic module that is connected to the selected storage unit along the preset direction.

In one possible embodiment, the preset direction is defined as a direction from the first storage unit of the first group of the storage units to the last storage unit of the last group of the storage units, where the groups of the storage units are in cascade interconnection. The cumulative count values shift from the current storage unit storing the cumulative count values to the next adjacent storage unit along the preset direction.

Figure 3:
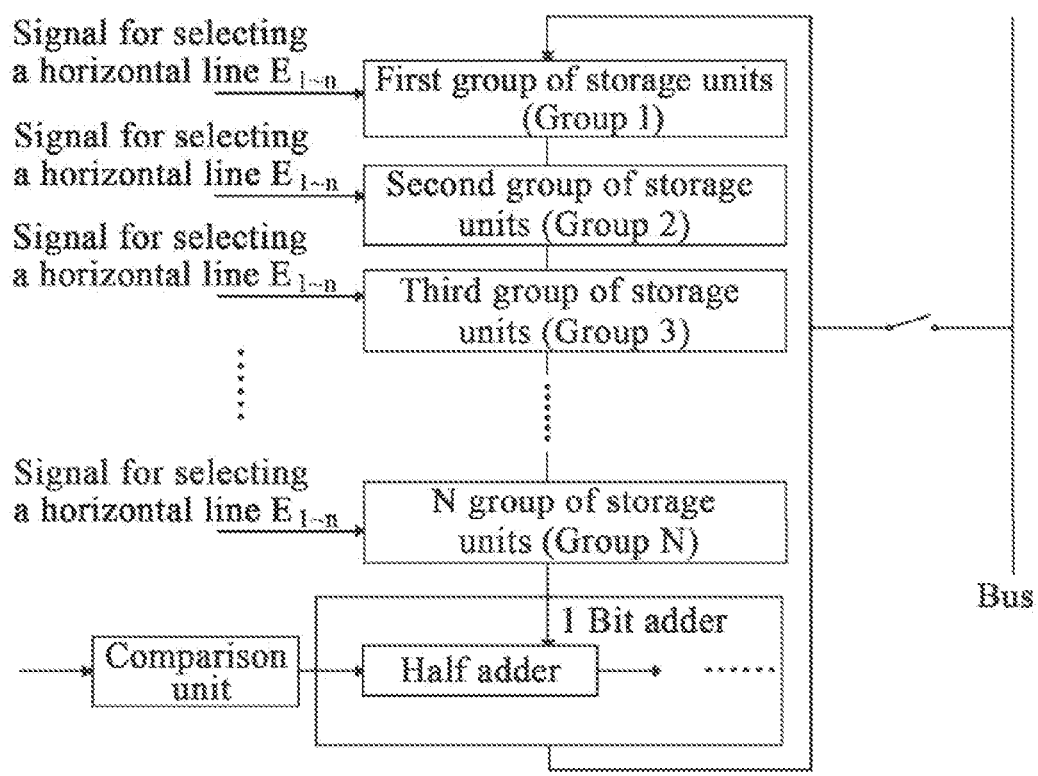
FIG. 3 is a schematic diagram showing another counting device in accordance with an embodiment of the present disclosure.

Taking the counting device shown in FIG. 3 as an example, signal E1 as the signal for selecting a horizontal line only selects each first storage unit located in each group of the storage units, for example from Group 1 to Group N, to store the cumulative count values. The counting device operates under the condition that these first storage units are shared storage units, and the preset direction is from the first storage unit of the first group of the storage units to the last storage unit of the last group of the storage units. When the control module outputs signal E1, the cumulative count values, assuming the initial value is 0, stored in the selected first storage unit of the first group of the storage units is replaced with the current cumulative count values A[i+1] that is output from the arithmetic module (such as a 1-bit adder) that is connected to the selected first storage unit along the preset direction. Meanwhile the current cumulative count values, assuming the initial value is 0, stored in the selected first storage unit of the second group (Group 2) of the storage units is replaced with the cumulative count values N[i] stored in the last storage unit of the first group of the storage units, and the rest may be deduced by analogy.

Optionally, the multiple storage units are configured as multiple groups of the storage units, and each storage unit at a preset position of the multiple groups of the storage units is controlled by the same signal for selecting a horizontal line. For example, six storage units in the storage module are divided into group A and group B, where each group of the storage units comprises three storage units. Three signals for selecting a horizontal line E1, E2, and E3 are respectively provided to control different storage units at the preset position of the two groups of the storage units. ie. E1 controls a storage unit a1 in group A and a storage unit b1 in group B; E2 controls a storage unit a2 in group A and a storage unit b2 in group B; and E3 controls a storage unit a3 in group A and a storage unit b3 in group B.

Optionally, the multiple storage units are further configured as each group of the storage units comprising at least two storage units. Different storage units in the same group of the storage units correspond to different signals for selecting a horizontal line, and the storage unit at the preset position of different groups of the storage units is controlled by the same signal for selecting a horizontal line. For example, six storage units in the storage module are divided into groups A and B, each group of the storage units comprises three storage units; different storage units a1, a2, and a3 in group A correspond to the signals for selecting a horizontal line E1, E2, and E3 respectively, and different storage units b1, b2, and b3 in group B correspond to the signals for selecting a horizontal line E1, E2, and E3 respectively. Such configuration is built for storage units a1 and b1 to be selected for storage simultaneously when the signal for selecting a horizontal line E1 is output.

The embodiments of the present invention count various objects therefore create various methods for the arithmetic module to receive count values. One embodiment provides the counting device with a comparison unit, which is connected to the arithmetic module. The comparison unit is provided to obtain a current count value by comparing an integral voltage converted from a current charge collected by a charge storage unit in multiple pixels with a preset reference voltage. The current count value is thus input to a calculation unit. One possible implementation is shown in FIG. 3 taking the comparison unit in FIG. 3 as an example. The charge storage unit is a capacitor; the integral voltage is the capacitor's integral voltage (a capacitance integral voltage); and a comparison result is a voltage comparison result. Thus before the arithmetic module processes calculation according to a received count value and the cumulative count values input via the last group of the storage unit, a voltage comparison result is regarded as a current received count value; when the arithmetic module is calculating according to the received count value and the cumulative count values input via the last group of the storage unit, where for one cumulative count values out of the plurality of count values currently stored in the multiple storage units, the arithmetic module takes the current received count value and the current cumulative count values as a cumulative counting result corresponding to the cumulative count values. In such case, the plurality of cumulative counting results are applied in indicating a total charge quantity collected by the charge storage units in various pixels. It should be understood that the charge storage units in various pixels include but are not limited to capacitors, or other electric charge storage units. It should be noted as well that the objects are not limited to the charge quantity mentioned above, but may be other electrical signals or in other forms, which is not limited in embodiments of the present invention.

The embodiments of the present invention provide various interconnection ways between the arithmetic module and the cascaded multiple storage units. One of the interconnection ways is that the arithmetic module is both connected to the first group of the storage units and the last group of the storage units, where the storage units are in cascade interconnection. Optionally, the arithmetic module is configured with at least one calculation unit. The number of the calculation units configured for the arithmetic module matches the number of the latches in the storage units. Each calculation unit is in cascade interconnection with the latches corresponding to the first storage unit and the last storage unit respectively. The calculation unit is configured as a half adder or a half subtractor.

The counting device further comprises an output module that is connected to the calculation unit for the purpose of outputting the plurality of cumulative counting results. In one possible implementation, the control module outputs multiple signals for selecting a horizontal line corresponding to the multiple storage units according to a preset sequence. Where one signal for selecting a horizontal line corresponds to at least one storage unit, which enables the storage units at different positions to be selected for storage based on the preset sequence so that the storage unit controlled by the output signal for selecting a horizontal line is able to receive the cumulative count values of its adjacently connected storage unit along the preset direction. At least one storage unit under the control of one signal for selecting a horizontal line is selected for storage. The at least one storage unit thus receives the cumulative count values in the storage unit that is adjacently connected to the at least one storage unit along the preset direction. This selection process is applicable to the following selections thus the signals for selecting a horizontal line are instructed in sequence to complete a control cycle. And each time after one control cycle, the cumulative count values stored in the multiple storage units are shifted to its next storage unit according to the preset direction in order. It should be understood that other end-around shift methods rather than the abovementioned end-around shift method should be adopted, for example in every cycle, the multiple storage units are divided into groups, and the cumulative count values as a whole stored in each storage unit moves a preset step according the preset direction in sequence.

Figure 6:
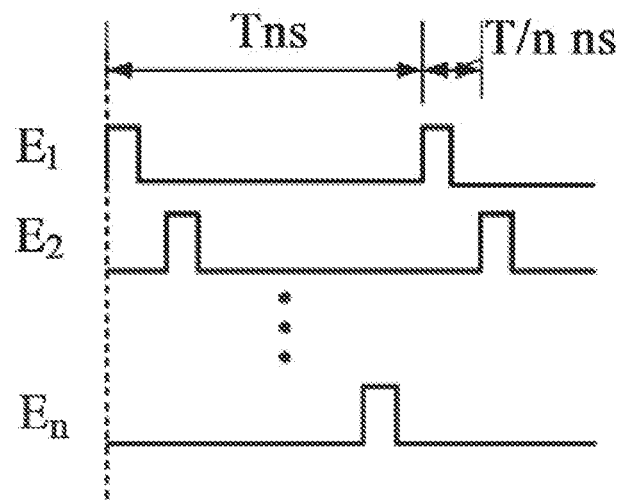
FIG. 6 is a schematic diagram showing a time sequence of a signal for selecting a horizontal line in accordance with an embodiment of the present disclosure.

Exemplarily, in the storage module shown in FIG. 4, each signal for selecting a horizontal line simultaneously controls N storage units located in their corresponding N groups of the storage modules. n signals for selecting a horizontal line are instructed in sequence in one control cycle so as to control and select in sequence each storage unit in N groups of the storage units. In the timing diagram of the signal for selecting a horizontal line shown in FIG. 6, T is the control cycle, and a time when each signal for selecting a horizontal line receiving the instruction to select is no greater than T/n. Especially in the control cycle, if the storage units selected for storage are the first storage units in each group of the storage units, the current cumulative count values could be obtained by combining the cumulative count values currently stored in the last storage units of each group of the storage units with the count values of corresponding objects. The current cumulative count values obtained from the addition is used as the cumulative count values stored in the first storage units.

Taking an example for better illustration, the arithmetic module is configured as a half adder. The half adder is connected between the first storage unit of the first group of the storage units and the last storage unit of the last group of the storage units, which is shown in FIG. 3. In a single end-around shift cycle, with such connection, the arithmetic module is able to obtain the cumulative count values currently stored in the last storage unit of the multiple storage units in cascade interconnection. And a sum of the obtained cumulative count values and the current count value of the object corresponding to the last storage unit is taken to be the cumulative counting result. Furthermore, if the cumulative counting result is smaller than a threshold value, which means that a counting process of the object has not reached a condition of stopping counting or a preset counting threshold, the cumulative counting result is therefore output to the first storage unit of the multiple storage units interconnected in series to be stored. If the cumulative counting result is not smaller than the threshold value, which means that the counting process has reached the condition of stopping counting or the preset counting threshold, under such circumstance the output module sequentially outputs multiple sets of cumulative counting results so that a subsequent circuit is able to obtain the cumulative counting result.

Figure 7:
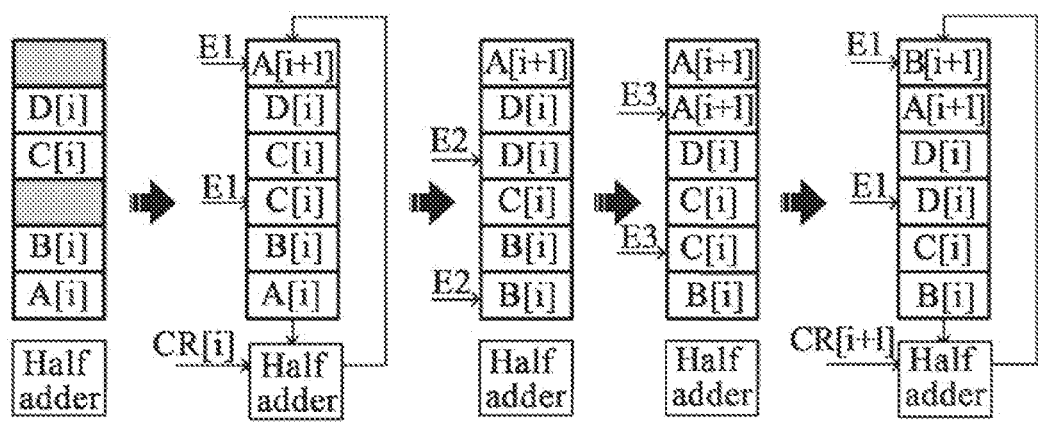
FIG. 7 is a schematic diagram schematically showing a data flow of multiple groups of storage units in accordance with an embodiment of the present disclosure.

Taking an example for better illustration, a data flow in the multiple groups of the storage units in the control cycle is shown in a schematic diagram of the data flow in FIG. 7. Assuming that the storage module includes two groups of the storage units and each group of the storage units includes three storage units. One storage unit among the three storage units is configured as the shared storage unit. The three storage units are respectively controlled by three signals for selecting a horizontal line and the storage units are further configured as the latches. The six storage units of the two groups of the storage units are interconnected in cascade, and the storage unit at a first line of each group of the storage units is configured as the shared storage unit. The storage units at a last line of the two groups of the storage units are connected to the storage units as the first line of the two groups of the storage units through an adder, which is also the arithmetic module. Furthermore, each group of the storage units store two cumulative count values, which means two storage units in each group of the storage units are used to respectively store the cumulative count values accumulated from the count values converted from the integral voltages of two capacitors. For example, a two groups of the latches which are also the two groups of the storage units are respectively configured as the latches respectively storing four count values A[i], B[i], C[i]. D[i], and as two latches used as the shared storage units. The latches at a corresponding position of the two groups of the latches are respectively controlled by signals E1, E2, E3, which means that E1 is used to control the shared storage unit located at the first line of the two groups of the storage units, E2 is used to control the latches A[i] and C[i], E3 is used to control the latches B[i] and D[i]. In conclusion, the end-around shift of the cumulative count values in the two groups of the latches is shown in FIG. 7:

(1) The arithmetic module compares the capacitance integral voltages of four capacitors with the reference voltage (Vref) of the comparison module to obtain an initial voltage comparison results. The initial voltage comparison results are used as an initial cumulative count values output to the four latches (ie. A[i]), B[i], C[i], D[i]) to be stored.

(2) When the arithmetic module is outputting a next voltage comparison result CR[i] obtained by the comparison module to the two groups of the latches, in a current control cycle, for either group of the latches, the signals for selecting a horizontal line E1, E2, E3 are sequentially set to high level so as to allow the cumulative count values stored in the two groups of latches to complete one shift. When setting E1 to high level, two shared latches at the first line of the groups of the latches are selected for storage, which means that the cumulative count values currently stored in a first group of the latches C[i] shift to the shared latch in a second group of the latches to be stored. The cumulative count values currently stored in A[i] of the second group of latches are output to the adder so as to be added with CR[i] to obtain the cumulative counting result A[i+1]. And the cumulative counting result A[i+1] thus shifts to the shared latch in the first group of the latches to be stored. By analogy, E2 and E3 are set to high level in order until the current control cycle completes. After the shift of the cumulative count values in the current control cycle, the cumulative count values stored in the storage module from top to bottom are changed from D[i], C[i], B[i], A[i] to A[i+1], B[i], C[i], D[i].

(3) When the arithmetic module output the next voltage comparison result CR[i+1] obtained by the comparison module to the two groups of the latches, the control module triggers a next control cycle, which means that a next shift of the cumulative count values stars. After this control cycle completes, the cumulative count values stored in the storage module from top to bottom are changed from A[i+1], B[i], C[i], D[i] to B[i+1], A[i+1], D[i], C[i].

(4) Multiple end-around shifts of the cumulative count values will be triggered until the counting process completes. The cumulative count values currently stored in the two groups of latches are used as a final cumulative counting result and output by the output module to the subsequent circuit through a bus line.

Figure 8:
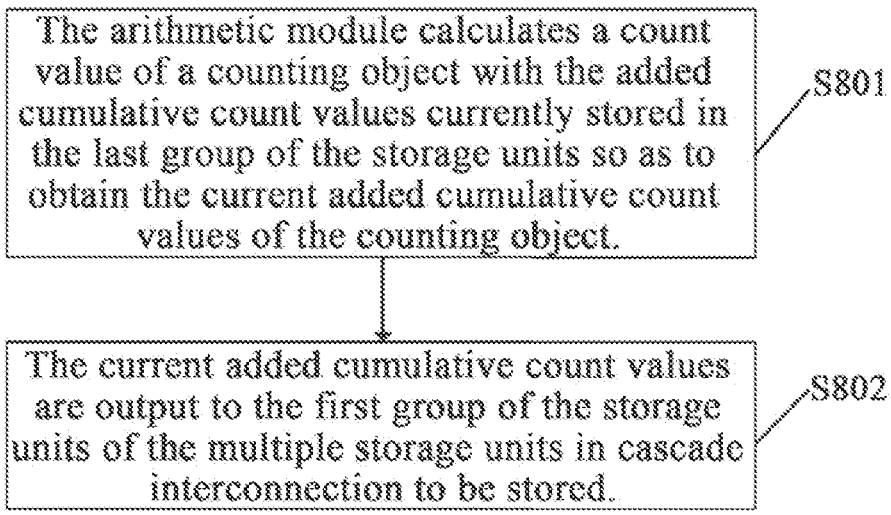
FIG. 8 is a schematic flowchart of a counting method according to an embodiment of the present disclosure.

(5) The embodiments of the present invention provide a counting method as shown in FIG. 8, which is applied to the counting device shown in FIG. 2 or 3. The counting device comprises a storage module and an arithmetic module. The storage module comprises multiple storage units in cascade interconnection. The arithmetic module is connected both to a first group of the storage units and a last group of the storage units of the multiple storage units. The multiple storage units store a plurality of cumulative count values. The multiple storage units are configured as at least one group of the storage units and the number of the storage units in each group is greater than the number of the storage units in each group storing the cumulative count values. The counting method comprises the following steps.

(6) The plurality of cumulative count values end-around shift to the arithmetic module to be calculated with a corresponding count value. Upon finishing counting, multiple current added cumulative count values stored in the storage module are used as a plurality of cumulative counting results of corresponding objects.

Each control cycle of an end-around shift goes through the following procedures at least once.

In S801, the arithmetic module calculates a count value of a object with the added cumulative count values currently stored in the last group of the storage units so as to obtain the current added cumulative count values of the object; and In S802, the current added cumulative count values are output to the first group of the storage units of the multiple storage units in cascade interconnection to be stored.

The counting method provided in the embodiments of the present invention shares similar working principle with the counting device. The working principle of the counting method could be referred to that of the counting device, which is omitted hereinafter.

Optionally, the counting method further comprises the following steps: the control module outputs the signals for selecting a horizontal line to the storage units. The signals for selecting a horizontal line are configured to control the end-around shift between the plurality of cumulative count values stored in the multiple storage units.

Furthermore, the multiple storage units are configured as multiple groups of the storage units, the multiple groups of the storage units located in a preset position of the multiple group of the storage units are subject to the same signal for selecting a horizontal line.

Furthermore, the multiple storage units are configured as each group of the storage units comprising at least two rows of the storage units, different storage units in the same group correspond to different signals for selecting a horizontal line.

Optionally, the signals for selecting a horizontal line are configured to control the end-around shift between the plurality of cumulative count values stored in the multiple storage units, as will be described below.

The signals for selecting a horizontal line are output in sequence to the multiple storage units through the control module. Once the storage unit is selected for storage, the cumulative count values of which will be replaced with the cumulative count values currently stored in the storage unit that is adjacently connected to the selected storage unit along a preset direction, or be replaced with a current cumulative count values output from the arithmetic module that is connected to the selected storage unit along the preset direction.

Optionally, in the counting method, the plurality of cumulative counting results are output through an output module.

Furthermore, before outputting the plurality of cumulative counting results through the output module, the control module outputs multiple signals for selecting a horizontal line corresponding to the multiple storage units according to the preset sequence. Where one signal for selecting a horizontal line corresponds to at least one storage unit. The storage module thus receives the signals for selecting a horizontal line corresponding to different storage units and cyclically outputs the plurality of cumulative counting results to the arithmetic module. In this way, the output module is able to receive and then output the plurality of cumulative counting results.

Optionally, each storage unit is configured with at least one latch, and different storage units comprise the same number of the latches, and the latches at corresponding positions of different storage units are sequentially in cascade interconnection.

Correspondingly, the arithmetic module is configured with at least one calculation unit. The number of the calculation units configured for the arithmetic module matches the number of the latches in the storage units. Each calculation unit is in cascade interconnection with the latches corresponding to a first storage unit and a last storage unit respectively.

The calculation unit is configured as a half adder or a half subtractor.

In one implementation of the counting method, the plurality of cumulative counting values are applied in indicating a total charge quantity collected by the charge storage units in various pixels. The counting method further comprises the following steps: a comparison unit is provided to obtain a current count value by comparing an integral voltage converted from a current charge collected by a charge storage unit in multiple pixels with a preset reference voltage.

The counting method provided in FIG. 8 is configured with the multiple storage units in cascade interconnection and a shared arithmetic module. The multiple storage units end-around shift to store the plurality of cumulative counting results of corresponding objects obtained from the shared arithmetic module. This configuration enables each storage unit to replace multiple latches corresponding to the existing data flip-flops in the prior art to carry out the function of storing count values, and in turn to dramatically reduce an area of the storage module in the counting device and to improve the dynamic range of a sensor. Moreover, an area required by the counting device is further reduced by sharing the arithmetic module, which facilitates the structural optimization of the sensor. In particular, if multiple objects are sharing the arithmetic module, the multiple storage units and other related modules, such as an output module, a comparison module, etc., the area of the counting device required for the multiple objects could be effectively reduced, and the counting device could be improved. This in turn improves the dynamic range and the performance of the sensor and is of assistance in configuring a circuit element that is composed of multiple objects in a small pixel.

Figure 9:
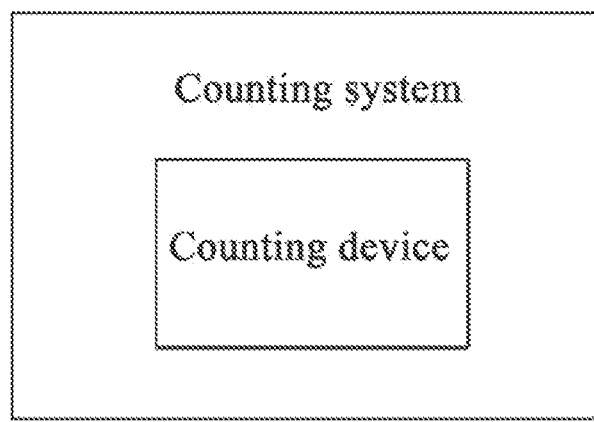
FIG. 9 is a schematic diagram showing a counting system in accordance with an embodiment of the present disclosure.

The present invention further provides a counting system, which is shown in FIG. 9. The counting system comprises at least one counting device and the counting device implements either embodiment provided in the embodiments corresponding to FIG. 2.

The present invention further provides a pixel array. The pixel array comprises a plurality of pixels and the counting device shared by the plurality of pixels. The counting device could be any counting device illustrated in the embodiments corresponding to FIG. 2.

Those skilled in the art should understand that the embodiments of the present application can be provided as a method, a system, or a computer program product. Therefore, this application may adopt the form of a complete hardware embodiment, a complete software embodiment, or an embodiment combining software and hardware. Moreover, this application may adopt the form of a computer program product implemented on one or more computer-usable storage media (including but not limited to disk storage, CD-ROM, optical storage, etc.) containing computer-usable program codes.

This application is described with reference to flowcharts and/or block diagrams of methods, equipment (systems), and computer program products according to this application. It should be understood that each process and/or block in the flowchart and/or block diagram, and the combination of processes and/or blocks in the flowchart and/or block diagram can be realized by computer program instructions. These computer program instructions can be provided to the processor of a general-purpose computer, a special-purpose computer, an embedded processor, or other programmable data processing equipment to generate a machine, so that the instructions executed by the processor of the computer or other programmable data processing equipment are generated It is a device that realizes the functions specified in one process or multiple processes in the flowchart and/or one block or multiple blocks in the block diagram.

These computer program instructions can also be stored in a computer-readable memory that can direct a computer or other programmable data processing equipment to work in a specific manner, so that the instructions stored in the computer-readable memory produce an article of manufacture including the instruction device. The device implements the functions specified in one process or multiple processes in the flowchart and/or one block or multiple blocks in the block diagram.

These computer program instructions can also be loaded on a computer or other programmable data processing equipment, so that a series of operation steps are executed on the computer or other programmable equipment to produce computer-implemented processing, so as to execute on the computer or other programmable equipment. Instructions provide steps for implementing functions specified in a flow or multiple flows in the flowchart and/or a block or multiple blocks in the block diagram. Obviously, those skilled in the art can make various changes and modifications to the application without departing from the spirit and scope of the application. In this way, the disclosure intends to include the changes, modifications and variations within the scope as defined by the appended claims.

What is claimed is:

1. A counting device, comprising:
  a storage module comprising a plurality of storage units in cascade interconnection; and
  an arithmetic module;
  wherein the plurality of storage units are configured to store a plurality of cumulative count values; the plurality of storage units are configured as at least one group of storage units, and in each group of storage units, the number of the storage units is greater than the number of the storage units storing the cumulative count values;
  the arithmetic module is connected to a first group of storage units and a last group of storage units; and is configured for calculation according to a received count value and an added cumulative count values input through the last group of storage units, so as to obtain a current added cumulative count values of an object, and output the current cumulative count value of the object to the first group of storage units;
  wherein the plurality of cumulative count values are end-around shifted to the arithmetic module for calculation with a corresponding count value until counting is completed; and a plurality of current added cumulative count values stored in the storage module are used as a plurality of cumulative counting results corresponding to the object.

2. The counting device of claim 1, further comprising:
a control module connected to the storage module, wherein the control module is operable to output a signal for selecting a horizontal line for controlling an end-around shift of the plurality of cumulative count values stored in the plurality of storage units.

3. The counting device of claim 2, wherein the plurality of storage units are configured as at least two groups of storage units in which storage units located in a preset position are controlled by the same signal for selecting a horizontal line.

4. The counting device of claim 3, wherein each group of storage units comprises at least two storage units each corresponding to different signals for selecting a horizontal line.

5. The counting device of claim 2, wherein the controlling an end-around shift between the plurality of cumulative count values stored in the plurality of storage units comprises:
outputting the signals for selecting a horizontal line in sequence to select a storage unit controlled by the output signals for selecting a horizontal line for storage; and
replacing a cumulative count value of a selected storage unit with a current cumulative count value stored in a storage unit that is connected to the selected storage unit along a preset direction, or with a current cumulative count value output from the arithmetic module that is connected to the selected storage unit along the preset direction.

6. The counting device of claim 2, further comprising:
an output module connected to the arithmetic module for outputting the plurality of cumulative count values.

7. The counting device of claim 6, wherein the control module is configured to: output a plurality of signals for selecting a horizontal line corresponding to the plurality of storage units according to a preset sequence, and one of the plurality of signals for selecting a horizontal line corresponds to at least one of the plurality of storage units;
wherein the storage module is configured to receive the signals for selecting a horizontal line corresponding to different storage units and cyclically output the plurality of cumulative counting results to the arithmetic module; and
wherein the output module is operable to receive and output the plurality of cumulative counting results.

8. The counting device of claim 1, wherein each of the plurality of storage units is provided with at least one latch, and different storage units each comprise the same number of latches, and the latches at corresponding positions of different storage units are sequentially in cascade interconnection.

9. The counting device of claim 8, wherein the arithmetic module comprises at least one calculation unit;
wherein the number of the at least one calculation unit corresponds to the number of the at least one latch in each of the plurality of storage units; each of the at least one calculation unit is in cascade interconnection with the latches at corresponding positions of a first storage unit and a last storage unit, respectively.

10. The counting device of claim 9, wherein the at least one calculation unit is configured as a half adder or a half subtractor.

11. A counting method using the counting device of claim 1, comprising:
performing end-around shift of the plurality of cumulative count values to the arithmetic module for calculation with a corresponding count value until the counting is completed, wherein the plurality of current added cumulative count values stored in the storage module are used as the plurality of cumulative counting results corresponding to the object;
wherein each cycle of the end-around shift goes through the following procedures at least once:
calculating, by the arithmetic module, a count value of the object with the added cumulative count values currently stored in the last group of the storage units to obtain the current added cumulative count values of the object; and
outputting the current added cumulative count values of the object to the first group of storage units for storage.

12. The counting method of claim 11, further comprising:
outputting, by a control module, a plurality of signals for selecting a horizontal line to the plurality of storage units for controlling the end-around shift between the plurality of cumulative count values stored in the plurality of storage units.

13. The counting method of claim 12, wherein the plurality of storage units are configured as at least two groups of storage units in which storage units located in a preset position are controlled by the same signal for selecting a horizontal line.

14. The counting method of claim 13, wherein each group of storage units comprises at least two rows of storage units, and different storage units in a group corresponds to different signals for selecting a horizontal line.

15. The counting method of claim 12, wherein the controlling the end-around shift of the plurality of cumulative count values stored in the plurality of storage units comprises:
outputting, by the control module, the signals for selecting a horizontal line in sequence to the plurality of storage units to select a storage unit controlled by the output signals for selecting a horizontal line for storage; and
replacing a cumulative count value of a selected storage unit with a cumulative count value currently stored in a storage unit that is adjacently connected to the selected storage unit along a preset direction, or with a current cumulative count value output from the arithmetic module that is connected to the selected storage unit along the preset direction.

16. The counting method of claim 12, further comprising:
outputting, by an output module, the plurality of cumulative counting results.

17. The counting method of claim 16, further comprising:
before outputting the plurality of cumulative counting results by the output module, outputting, by the control module, a plurality of signals for selecting a horizontal line corresponding to the plurality of storage units according to a preset sequence, wherein one of the plurality of signal for selecting a horizontal line corresponds to at least one of the plurality of storage units;
receiving, by the storage module, signals for selecting a horizontal line corresponding to different storage units; and cyclically outputting the plurality of cumulative counting results to the arithmetic module; and
receiving and outputting, by the output module, the plurality of cumulative counting results.

18. The counting method of claim 11, wherein each of the plurality of storage units is provided with at least one latch;

and different storage units each comprise the same number of latches, and latches at corresponding positions of different storage units are sequentially in cascade interconnection; and the arithmetic module is configured with at least one calculation unit; the number of the at least one calculation unit corresponds to the number of the at least one latch in each of the plurality of storage units; and each of the at least one calculation unit is in cascade interconnection with latches at corresponding positions of a first storage unit and a last storage unit, respectively.

19. A counting system comprising the counting device of claim 1.

20. A pixel array using the counting device of claim 1 for determining a charge collected by pixels in the pixel array.

* * * * *